United States Patent
Carroll et al.

(10) Patent No.: US 8,024,138 B2
(45) Date of Patent: Sep. 20, 2011

(54) POWER SUPPLY CIRCUITRY, COLLECTION AND REPORTING OF POWER SUPPLY PARAMETER INFORMATION

(75) Inventors: Robert T. Carroll, Andover, MA (US); James Noon, Merrimack, NH (US); Venkat Sreenivas, Winchester, MA (US); Gary D. Martin, Boxford, MA (US)

(73) Assignee: International Rectifier Corporation, El Segundo, CA (US)

( * ) Notice: Subject to any disclaimer, the term of this patent is extended or adjusted under 35 U.S.C. 154(b) by 442 days.

(21) Appl. No.: 12/143,056

(22) Filed: Jun. 20, 2008

(65) Prior Publication Data

US 2009/0198460 A1 Aug. 6, 2009

Related U.S. Application Data

(60) Provisional application No. 61/025,534, filed on Feb. 1, 2008.

(51) Int. Cl.
*G01R 21/06* (2006.01)
(52) U.S. Cl. ............... 702/60; 702/64; 702/79; 702/81; 702/189
(58) Field of Classification Search .................. 713/300; 702/60, 64, 79, 81, 189; 700/296; 363/16, 363/20, 75; 323/283, 285

See application file for complete search history.

(56) References Cited

U.S. PATENT DOCUMENTS

| | | | | |
|---|---|---|---|---|
| 5,138,543 A | * | 8/1992 | Harm et al. | 363/21.08 |
| 6,326,771 B1 | * | 12/2001 | Popescu-Stanesti | 320/139 |
| 6,351,396 B1 | * | 2/2002 | Jacobs | 363/21.06 |
| 7,105,950 B2 | * | 9/2006 | Bemat et al. | 307/52 |
| 7,211,992 B2 | * | 5/2007 | King | 323/283 |
| 7,642,758 B2 | * | 1/2010 | Morong et al. | 323/206 |
| 2006/0015274 A1 | * | 1/2006 | Trandafir et al. | 702/64 |

OTHER PUBLICATIONS

Prodic et al., 'Digital PWM Controller and Current Estimator for A Low-Power switching Converter', Jul. 16-18, 2000, IEEE Publication, pp. 1-6.*

* cited by examiner

*Primary Examiner* — Mohamed Charioui
*Assistant Examiner* — Elias Desta
(74) *Attorney, Agent, or Firm* — Chapin IP Law, LLC

(57) ABSTRACT

In an example configuration, a power supply manager receives an output current value representing an amount of output current supplied by one or more power converter phases to a load. The power supply manager also receives a duty cycle value representing a duty cycle for controlling operation of the at least one power converter phase. The power supply manager produces an estimate of input current supplied to the power supply circuit based at least in part on multiplying the output current value by the duty cycle value. Contrary to conventional methods such as physically measuring an input current using complex measuring circuitry, embodiments herein include utilizing parameter information such as output current information and duty cycle information to deduce an amount of input current.

29 Claims, 9 Drawing Sheets

POWER SUPPLY CIRCUITRY, COLLECTION AND REPORTING OF POWER SUPPLY PARAMETER INFORMATION

RELATED APPLICATIONS

This application is related to and claims the benefit of earlier filed U.S. Provisional Patent Application Ser. No. 61/025,534 filed on Feb. 1, 2008, and entitled "METHOD AND APPARATUS TO REPORT INPUT CURRENT, INPUT POWER AND EFFICIENCY IN BUCK REGULATORS," the entire teachings of which are incorporated herein by this reference.

BACKGROUND

It is known that a conventional voltage regulator module (VRM) can be used to regulate a DC voltage supplied to a load such as a microprocessor. A VRM can include a power converter, such as a DC-DC converter, and may include other components such as a controller for controlling operation of the power converter.

An example of a DC-DC converter is a synchronous buck converter, which has minimal components, and therefore is widely used in VRM applications. In an example application, the input voltage to the buck converter is typically $12V_{DC}$. An output voltage produced by the VRM may be $5.0V_{DC}$, 3.3 $V_{DC}$, or even lower.

Conventional multiphase interleaved VRM power supply topologies can include two or more power converter phases that operate in parallel with each other to convert power and supply power to a corresponding load. Implementation of a multiphase voltage converter topology (as compared to a single voltage converter phase topology) can therefore enhance the output current capability of a power supply system.

A typical configuration of a VRM such as a so-called synchronous buck converter includes an inductor, a high side switch, and a low side switch. A controller associated with the buck converter repeatedly pulses the high side switch ON to convey power from a power source through the inductor to a dynamic load. The controller repeatedly pulses the low side switch ON to provide a low impedance path from a node of the inductor to ground in order to control an output of the buck converter. Thus, the energy stored in the inductor increases during a time when the high side switch is ON and decreases during a time when the low side switch is ON. During switching operation, the inductor transfers energy from the input to the output of the converter to keep the output voltage at a relatively fixed value.

There has been increased motivation in the industry to produce yet more efficient power supply circuits so as to reduce losses. Accordingly, a significant amount of money has been spent to develop more efficient power supply circuits.

In addition to producing higher efficiency circuits, there has been an impetus in the industry to supply health/status information associated with operation of a power supply circuit to other entities via a respective communication link. One such parameter is the efficiency of a respective power supply circuit. However, this parameter is not easy to measure or calculate because it is based on input current or input power, which itself is difficult to measure.

In general, the efficiency of a power supply circuit can be calculated based on the amount of power supplied as an input to the power supply circuit versus the amount of power outputted by the power supply circuit to power a load. When there are very few losses in a power supply, the efficiency is very high because most input power is conveyed to a load.

One way to measure input current of a power supply circuit is to measure a voltage across a resistor disposed in series with an input voltage source used to power a power supply circuit. Based on the voltage across the series resistor, it is possible to detect the amount of current supplied by the voltage source the power supply circuit. Input power can be calculated based on the detected amount of input current at a particular input voltage.

BRIEF DESCRIPTION

Conventional voltage converter circuits as discussed above suffer from a number of deficiencies. For example, power supply circuits such as conventional synchronous buck converters internally dissipate a portion of energy received from a respective power source in lieu of conveying all of the energy received from a respective power source to a corresponding load. This wasted energy precipitates out of the buck converter circuit as unwanted heat, which (if too high) can increase the likelihood of damage to the buck converter or other nearby electronic components. Losses (e.g., dissipation of unwanted heat) associated with the buck converter increase an amount of power that must be provided to the buck converter so that it can maintain an output voltage within a range.

As discussed above, one way to measure the input current of a power supply is to measure a voltage across a series resistor of an input voltage source used to power a power supply circuit. Based on the voltage across the series resistor, it is possible to detect the amount of current supplied by the voltage source the power supply circuit.

Measuring an amount of current supplied by a voltage source using a series resistor as mentioned above has drawbacks. For example, implementing a series resistor in a path of the input voltage results in yet further power losses in a respective power supply circuit because at least a portion of the power supplied by the input voltage source will be dissipated by the series resistor rather than in the corresponding switching circuitry of the power supply where it is needed most.

Additionally, measuring the voltage across the series resistor can be challenging because the common mode voltage of the series resistor is nearer the input voltage value than it is to ground. To accurately measure the voltage across the series resistor would require special circuitry to overcome such operating conditions.

Techniques discussed herein deviate with respect to conventional applications such as those discussed above. For example, certain embodiments herein are directed to producing an accurate estimate of an amount of input current supplied to a switching power supply circuit. Based on the estimated amount of input current and other power supply parameters, it is possible to derive other parameters such as input power, power supply efficiency, etc.

More specifically, according to one configuration, a power supply manager receives an output current value representing an amount of output current supplied by one or more power converter phases to a load. The power supply manager also receives a duty cycle value representing a duty cycle for controlling operation of the at least one power converter phase. The power supply manager produces an estimate of input current supplied to the power supply circuit based at least in part on multiplying the output current value by the duty cycle value. Thus, a power supply manager according to embodiments herein is able to produce an estimate of input current supplied to the power supply circuit based on use of a control input such as the duty cycle of one or more power converter phases. Contrary to conventional methods, such as physically measuring an input current using complex measuring circuitry, embodiments herein include utilizing readily available information (e.g., control information as well as feedback information) to deduce an amount of input current.

In one embodiment, the duty cycle represents a portion of a switching cycle associated with one or more high side switch devices in the power converter phases. The longer the high side switches are activated, the more power that is conveyed through the high side switch devices to a storage element such as an inductor that, in turn, delivers the power to the load.

Note that the power supply manager can derive additional values such as a power output parameter of the one or more power converter phases. For example, in one embodiment, the power supply manager receives an output voltage value representing an output voltage of the one or more power converter phases used to drive a respective load. The power supply manager produces a power output value associated with the one or more power converter phases based on multiplying the received output voltage value by the estimate of the input current. The power output value represents an amount of power supplied by the one or more power converter phases to the load via the output voltage.

Additionally, the power supply manager can receive an input voltage value representing an input voltage of a source supplying the input current to the one or more power converter phases. The power supply manager produces an estimate of input power supplied by the source to the at least one power converter phase based on multiplying the input voltage value by the estimate of the input current.

Efficiency of the power supply can be calculated based on dividing the output power by the input power. In one embodiment, power supply system as discussed herein is a non-isolated DC-DC converter.

In one embodiment, the power supply system includes multiple power converter phases. The duty cycle value as discussed above can represent an average duty cycle of multiple corresponding duty cycles that are used to control operation of the multiple power converter phases. The output current value can be a summation of current supplied by each of the multiple power converter phases to the load. The input current can be estimated for multiple power converter phases based on multiplying the average duty cycle by the combined output current of the multiple power converter phases.

As will be discussed later in this specification, the estimated input current can be adjusted to account for other current consumed by other sources such as bias current used to power circuitry that controls operation of the at least one power converter phase, switch losses, etc. The amount of adjustments made to an estimated input current value may depend on how many power converter phases are activated to drive a respective load because losses in a respective power supply may vary depending on how many power converter phases are activated.

Embodiments herein are particularly useful in applications where a status of a power supply system is of concern. Based on the estimate of input current and/or other power supply parameters, it is possible to determine a health status of the one or more power converter phases. As previously discussed, the cost of implementing such functionality can be minimal as such information can be calculated using standard parameters already available to a power supply.

In yet further embodiments, the parameter management system can include a first storage resource and a second storage resource. The first storage resource maintains a first value representing an amount of output current supplied by at least one power converter phase to a load. The second storage resource maintains a second value representing a duty cycle for controlling operation of the at least one power converter phase. The parameter management circuit includes appropriate hardware to produce an estimate of input current supplied to the power supply circuit based at least in part on multiplying the first value by the second value. The estimate of input current can be used to determine a health status of the at least one power converter phase. For example, if the estimated input current is outside of an expected range, it can be determined that there is a possible failure associated with the power supply, load, etc.

In further embodiments, the parameter management circuit includes one or more programmable filters to filter sampling of the amount of output current and the duty cycle over time. The parameter management circuit can be configured to update the estimate of input current based on the filtered sampling.

The parameter management circuit can include a programmable resource to set a refresh rate for the different parameters managed by the parameter management circuit. In one embodiment, the parameter management circuit is configured to update the estimate of input current based on a setting of the refresh rate. An external source can access the programmable resource. Accordingly, the external source can control the refresh rate of the different parameters.

The parameter management circuit can include a storage resource to maintain an output voltage value representing an output voltage of the at least one power converter phase. In such an embodiment, the parameter management circuit is configured to produce a power output value associated with a corresponding one or more power converter phases based on multiplying the output voltage value by the estimate of the input current.

In yet further embodiments, the parameter management circuit can include a storage resource to maintain an input voltage value representing an input voltage of a source supplying the input current to the at least power converter phase. In such an embodiment, the parameter management circuit is configured to produce an estimate of input power supplied by the source to the one or more power converter phases based on multiplying the input voltage value by the estimate of the input current. The estimated input power can be used to determine a power efficiency associated with a respective power supply. In one embodiment, the power efficiency is equal to the output power divided by the input power.

Although techniques herein are well suited for use in switching power supply circuit, it should be noted that embodiments herein are not limited to use in such applications and that the techniques discussed herein are well suited for other applications as well.

It is to be understood that each of the systems, methods, and apparatuses herein can be embodied strictly as a software program, as a hybrid of software and hardware, or as hardware alone such as within a processor, or within an operating system or within a software application, or via a non-software application such a person performing all or part of the operations.

Note that each of the different features, techniques, configurations, etc. discussed herein can be executed independently or in combination with any or all other features also described herein. Accordingly, the present invention can be embodied, viewed, and claimed in many different ways.

This Brief Description section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives or permutations of the invention, the reader is directed to the Detailed Description section and corresponding figures of the present disclosure as further discussed below.

BRIEF DESCRIPTION OF THE DRAWINGS

The foregoing and other objects, features, and advantages of the invention will be apparent from the following more particular description of preferred embodiments herein, as illustrated in the accompanying drawings in which like reference characters refer to the same parts throughout the different views. The drawings are not necessarily to scale, with emphasis instead being placed upon illustrating the embodiments, principles and concepts.

DETAILED DESCRIPTION

Figure 1:
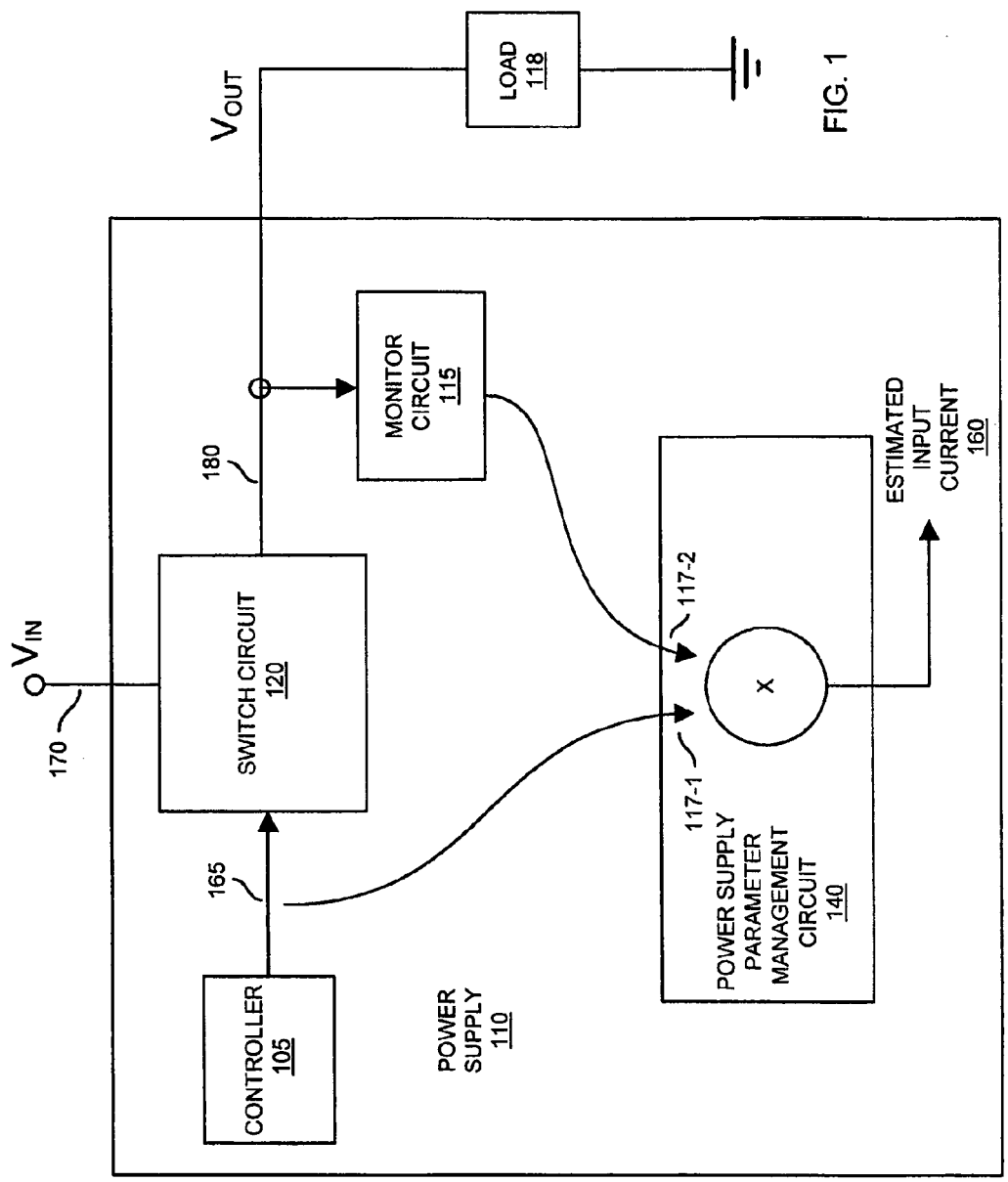
FIG. 1 is an example diagram of a power supply system including a parameter management circuit according to embodiments herein.

FIG. 1 is a diagram of an example power supply system 110 according to embodiments herein. As shown, power supply system 110 includes controller 105, switch circuit 120, monitor circuit 115, and power supply parameter management circuit 140.

In one embodiment, the power supply 110 receives input power from one or more sources including voltage source $V_{IN}$ labeled input voltage 170. A combination of the resources in power supply system 110 produces a substantially constant output voltage 180 for driving dynamic load 118. By way of a non-limiting example, the output voltage can be a DC voltage of 1.5+/−0.05 VDC or any other value appropriate voltage for driving a load.

By way of a non-limiting example only, the power supply 110 system as discussed herein can be a non-isolated DC-DC converter.

The switch circuit 120 generates the output voltage 180 based on control signals 165 generated by controller 105. In general, the controller 105 monitors the output voltage 180 and drives switch circuit 120 with control signals 165 so that output voltage 180 is maintained within a desired range. Power supply parameter management circuit 140 receives parameter information 117-1 indicating a duty cycle for operating switch circuit 120. In an example embodiment, the duty cycle is a pulse width modulation signal specifying how long to activate a high side switch in switch circuit to convey power from input voltage 170 to output voltage 180. This embodiment will be discussed in more detail later in this specification.

The switch circuit 120 can be a switching power supply circuit such as an asynchronous buck converter, a synchronous buck converter, etc., or any other circuit that converts an input voltage 170 to an output voltage 180 for driving a circuit such as load 118.

Load 118 can be electronic circuitry such as a microprocessor that consumes different amounts of power over time depending on its current power needs. In one embodiment, the current requirements or load 118 can quickly change from as low as less than several amps to over one hundred or more amps.

Monitor circuit 115 monitors current supplied by switch circuit 120 to load 118. Based on monitoring of the current, the monitor circuit 115 produces and forwards power supply parameter information 117-2 to power supply parameter management circuit 140. The power supply parameter information 117-2 indicates an amount of current delivered by the switch circuit 120 to load 118.

As will be discussed further herein, the power supply parameter management circuit 140 monitors parameters associated with the power supply 110 and status information such as an estimated input current supplied by input voltage 170. This information and other parameter information is made available to other circuitry in communication with the power supply 110.

More specifically, by way of a non-limiting example, recall that power supply parameter management circuit 140 receives parameter information 117-1 indicating a parameter such as the duty cycle used to drive switch circuit 120 to produce output voltage 180 within an acceptable range. Recall that power supply parameter management circuit 140 receives parameter information 117-2 indicating an amount of current delivered by switch circuit 120 to load 118.

Based on the received parameter information 117, the power supply parameter management circuit 140 can estimate an amount of input current supplied by input voltage 170 to switch circuit 120. For example, the power supply parameter management circuit 140 can be configured to multiply the duty cycle by the amount of output current to drive load 118 to produce an estimated input current 160.

Generation of and distribution of the estimated input current 160 by power supply parameter management circuit 140 can be useful in applications keeping track of how much current is drawn from the input voltage 170 for powering load 118.

As previously discussed, conventional power supply applications measure the input current by placing a resistor in a path between the input voltage 170 and the switch circuit 120. Contrary to these conventional power supply applications, embodiments herein include deducing the input current supplied by $V_{IN}$ based on available parameter information rather than use of complex circuitry to measure such a parameter.

Note that the power supply can include one or more inductors in the output of switch circuit 120 to convey current to the load 118. The inductor current includes many of the losses in the converter, such as inductor resistive losses and interconnects trace losses. In an ideal, lossless buck regulator with feedback control, the pulse width can be determined by the ratio of the output voltage to the input voltage. When losses are introduced, the feedback control modifies a value of the pulse width(s) to offset losses such as MOSFET resistance and body diode conduction.

To obtain a first order approximation of the input current, embodiments herein can include digitally multiplying the average inductor current by the average pulse width used to drive the respective power converter phases in switch circuit 120). The power supply 110 can include a feedback loop in which the controller 105 monitors the output voltage 108 and adjusts the pulse width modulation accordingly so that the output voltage 180 is maintained within an acceptable range.

As discussed in more detail below, embodiments herein can include calibration or adjustment features to account for losses in the power supply 110 that are not captured by measurement of the output current, which represents the amount of current through respective inductors of the power supply 110. Accordingly, embodiments herein can include calculating an input current based on a number of operating conditions of the power supply 110.

Figure 2:
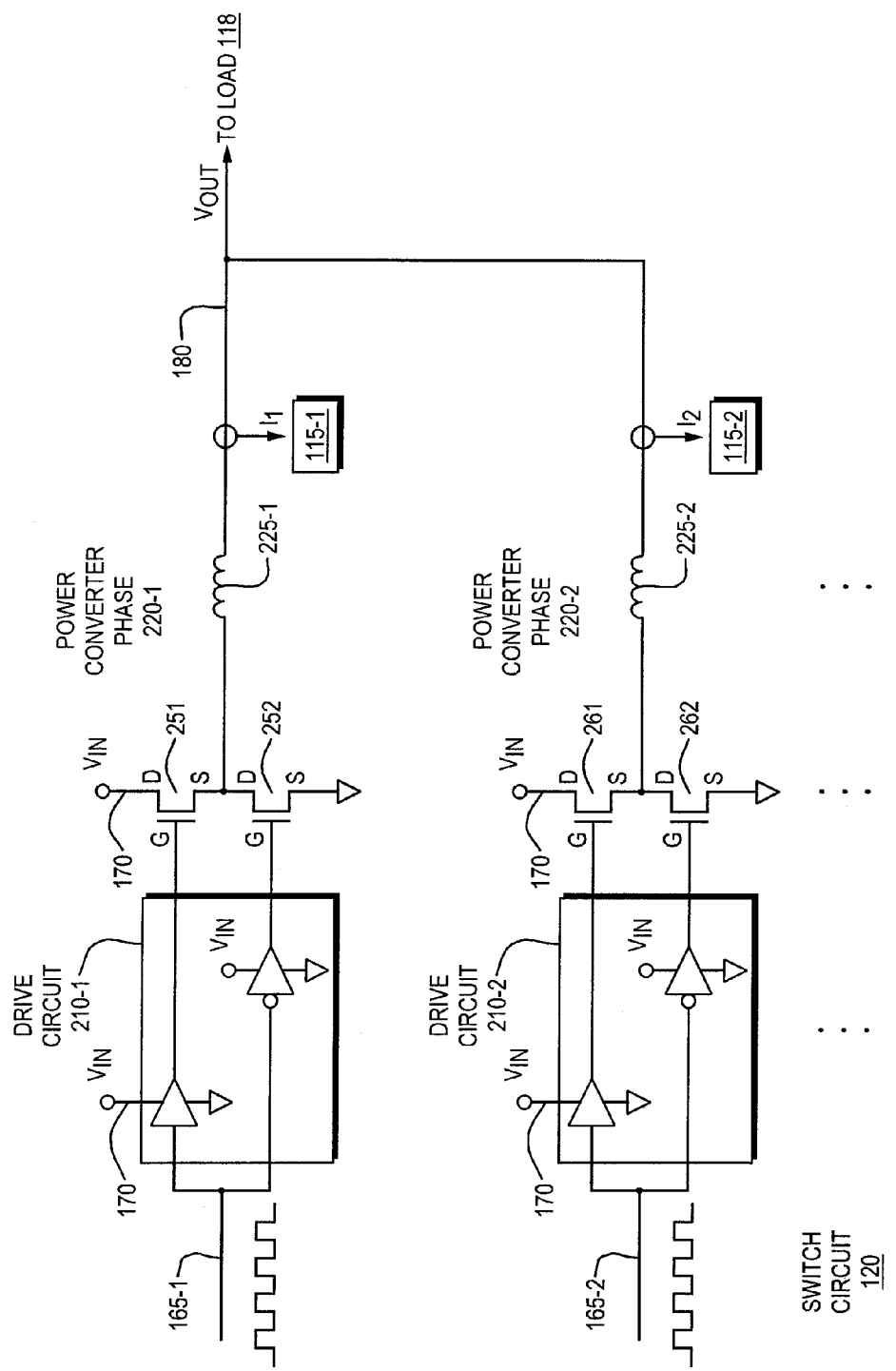
FIG. 2 is an example diagram illustrating a switching power supply circuit according to embodiments herein.

FIG. 2 is an example diagram illustrating use of switch control signal(s) 165 to control one or more power converter phases 220 according to embodiments herein. As shown, example switch circuit 120 includes multiple power converter phases, each of which has a corresponding high side switch and low side switch to supply current through a corresponding storage device 225 of a respective power converter phase to load 118.

For example, switch circuit 120 includes power converter phase 220-1. Power converter phase 220-1 includes driver circuit 210-1. During operation, driver circuit 210-1 drives respective gates of high side switch 251 and low side switch 252 depending on the duty cycle of control signal 165-1 (as produced by controller 105). For example, when the control signal 165-1 is a high level, the drive circuit 210-1 drives the gate of high side switch device 251 with a voltage such as 8 volts to turn switch device 251 to an ON state during which the switch device 251 conveys power from input voltage 170 through storage device 225-1 to load 118. When the high side switch device is activated as discussed above, the drive circuit 210-1 simultaneously drives switch device 252 with a low voltage such as 0 volts to deactivate switch device 252.

Conversely, when the control signal 165-1 is a low level, the drive circuit 210-1 drives the gate of switch device 251 with a low voltage such as zero volts to turn high side switch device 251 to an OFF state during which the switch device 251 prevents conveyance of power from input voltage 170 through storage device 225-1 to load 118. When the high side switch device is deactivated as discussed above, the drive circuit 210-1 simultaneously drives switch device 252 with a high voltage such as 8 volts to activate switch device 252.

Thus, during operation of power converter phase 220-1, only one of the switch device 251 and the switch device 252 is activated at a given time. Turning the switch devices ON and OFF in this manner produces output voltage 180 for powering load 118.

The power converter phase 220-2 operates in a similar manner as discussed above for power converter phase 220-1. For example, switch circuit 120 includes power converter phase 220-2. Power converter phase 220-2 includes driver circuit 210-2. During operation, driver circuit 210-2 drives respective gates of high side switch 261 and low side switch 262 depending on the duty cycle of control signal 165-2.

For example, when the control signal 165-2 is a high level, the drive circuit 210-2 drives the gate of high side switch device 261 with a voltage such as 8 volts to turn switch device 261 to an ON state during which the switch device 261 conveys power from input voltage 170 through storage device 225-2 to load 118. The drive circuit 210-2 simultaneously drives switch device 262 with a low voltage such as 0 volts to deactivate switch device 262.

Conversely, when the control signal 165-2 is a low level, the drive circuit 210-2 drives the gate of switch device 261 with a low voltage such as zero volts to turn high side switch device 261 to an OFF state during which the switch device 261 prevents conveyance of power from input voltage 170 through storage device 225-2 to load 118. The drive circuit 210-2 simultaneously drives switch device 262 with a high voltage such as 8 volts to activate switch device 262.

Thus, during operation of power converter phase 220-2, only one of the switch device 261 and the switch device 262 is activated at a given time.

Switch circuit 120 can include any number of power converter phases. Note that phases of the control signals 165 can be adjusted to reduce an overall amount of ripple voltage associated with output voltage 180.

In an ideal power supply, the output voltage of a synchronous buck converter is equal to the duty cycle multiplied by the input voltage of the converter. However, due to losses in the circuit such as resistive losses in traces and inductors, the controller typically has to drive the phases with slightly higher duty cycles to maintain the output voltage 180 at a desired voltage level. Thus, the duty cycle or pulse width modulation value produced by controller 105 includes information accounting for losses in the power supply circuit 110.

Figure 3:
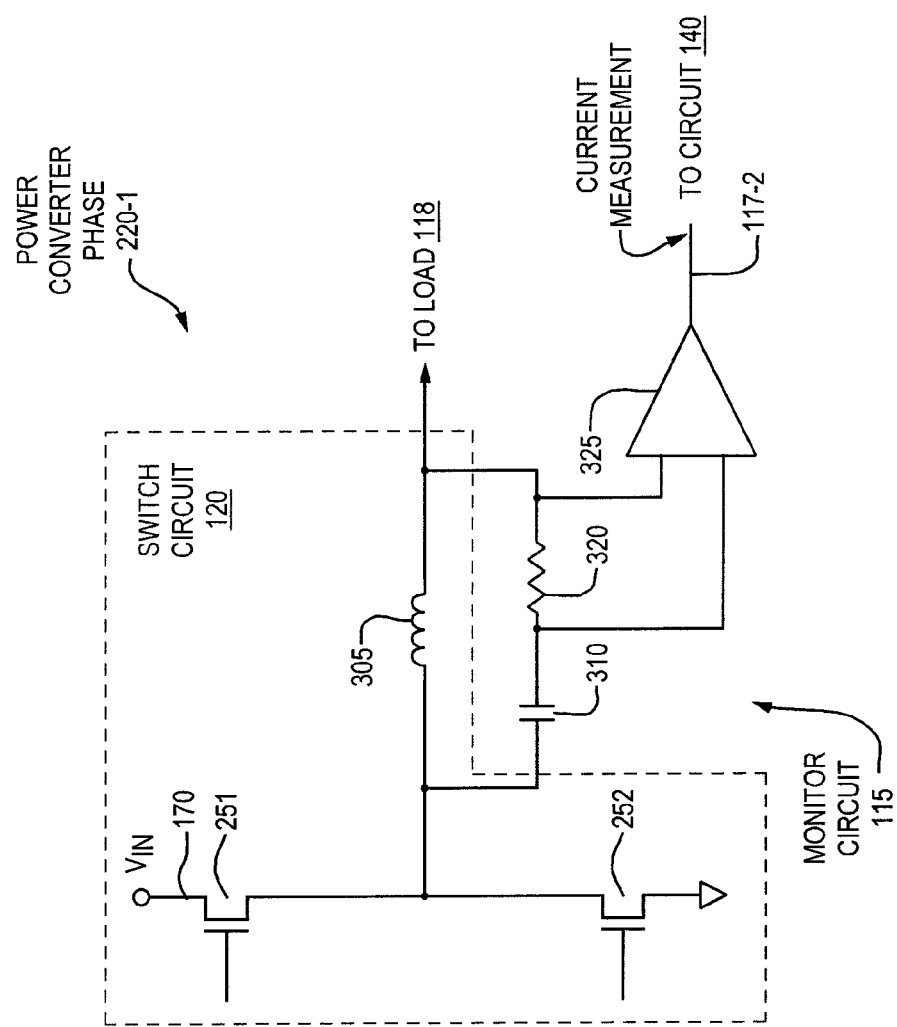
FIG. 3 is an example diagram of a current monitor according to embodiments herein.

FIG. 3 is a diagram illustrating an example monitor circuit 115 to measure current in each of one or more power converter phases. As shown, a combination of high side switch 251, low side switch 252, and inductor 305 forms a switching phase in switch circuit 120. The inductor 305 acts as an energy storage device to deliver power to the load 18 even when high side switch device 251 is deactivated.

The example monitor circuit 115 includes a serially connected capacitor 310 and resistor 320 disposed in parallel with inductor 305. Inputs of integrator circuit 325 are connected across resistor 320. Monitoring the voltage across resistor 320 produces an output voltage whose output is proportional to the amount of current supplied by the respective phase to load 118. Thus, by way of a non-limiting example, monitor circuit 115 is able to monitor an amount current provided by a respective power converter phase in switch circuit 120.

In a similar manner as discussed above for power converter phase 220-1 as discussed above, the monitor circuit 115 can be configured to measure current for each of multiple phases in switch circuit 120.

As previously discussed, the monitor circuit 115 forwards the current measurement information as input parameters 117 to power supply parameter management circuit 140. In such an embodiment, the monitor circuit 115 in power supply 100 is configured to detect an amount of current delivered by each of multiple phases in a switch circuit 110. A combination of the current produced by each of the multiple phases can deliver enough power to the dynamic load to maintain a voltage of the dynamic load at a substantially fixed voltage value.

Figure 4:
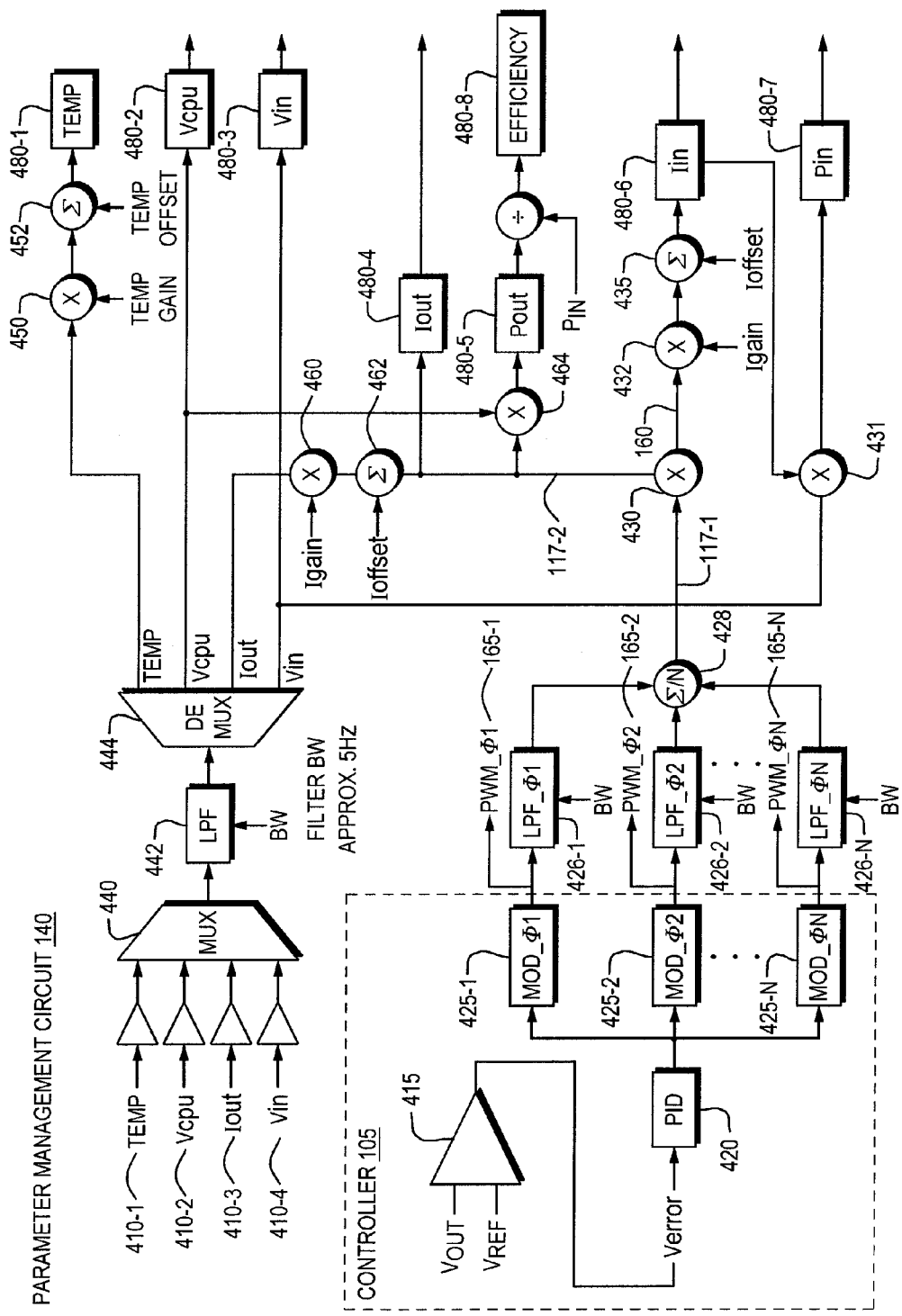
FIG. 4 is an example diagram illustrating a parameter management circuit according to embodiments herein.

FIG. 4 is an example diagram illustrating a power supply parameter management circuit 140 according to embodiments herein. The power supply parameter management circuit 140 can be embodied in a number of different ways such as an algorithm executed by a corresponding processor, combinational logic, etc.

As shown, controller 105 includes a difference circuit 415 that compares the output voltage 180 ($V_{OUT}$) to a reference voltage. The output of the difference circuit 415 represents an error voltage $V_{ERROR}$ fed to PID circuit 420 for purposes of generating one or more pulse width modulation control signals 165.

The PID circuit 420 of controller 105 provides input to modulator circuits 425 such as modulator circuit 425-1, modulator circuit 425-2, . . . , modulator circuit 425-N. Such input by the PID circuit 420 specifies the pulse width modulation signal to be generated by each modulator 425. Each modulator controls a corresponding power converter phase in the power supply 110.

As an example, modulator 425-1 receives input from PID circuit 420 indicating a pulse width modulation signal (i.e., control signal 165-1) to be generated by modulator 425-1 to drive a first power converter phase circuit in power supply 110, modulator 425-2 receives input from PID circuit 420 indicating a pulse width modulation signal (i.e., control signal 165-2) to be generated by modulator 425-2 to drive a second power converter phase circuit in power supply 110, and so on.

Parameter management circuit 140 includes low pass filter circuits 426 such as low pass filter circuit 426-1, low pass filter circuit 426-2, ..., of 426-N to filter the pulse width modulation signals generated by modulators 425. The low pass filter circuits 426 help to produce more stable readings by filtering out transient conditions.

In one embodiment, the filter bandwidth is approximately 5 hertz, although this can vary depending on the application.

Settings such as the bandwidth of the filters can be programmable.

The output of the low pass filter circuits 426 feed into module 428. Module 428 performs an averaging function.

For example, as shown, module 428 receives pulse width modulation values used to drive the corresponding power converter phases. The module 428 produces an average pulse width modulation value based on a combination of N power converter phases.

As a more specific example, suppose that N=3 and that the pulse width modulation value for a first phase from circuit 426-1 is 51%, the pulse width modulation for a second phase from circuit 426-2 is 51%, and the pulse width modulation for a third phase is 57%. In such an instance, the output of module 428 would be a digital value representing specifying an average pulse width modulation value of 53%, which is an average pulse width modulation value for the three phases.

Parameter information 117-1 outputted from module 428 represents an average pulse width modulation value for controlling phases in power supply 110. The parameter information 117-1 is inputted to module 430.

Additional input to module 430 is received from other sources. For example, parameter management circuit 140 also includes multiplexer 440 and de-multiplexer 444 for receiving and managing additional parameter information associated with power supply 110. Use of the multiplexer 442 and de-multiplexer 444 reduces overhead as a single digital filter circuit 442 can be used to filter a number of different input signals including Temp, $V_{CPU}$ (e.g., output voltage 180), $I_{OUT}$, and $V_{IN}$ (e.g., input voltage 170).

In one embodiment, the low pass filter circuit 442 is set to an approximate filter bandwidth of 5 hertz.

Recall that the monitor circuit 115 measures the output current of each of the phases. In one embodiment, information parameter 410-3 is a digital value representing the total current supplied by the switch circuit 120 to the load 118.

In one embodiment, a value representing the total output current (such as Iout) for the power supply 110 can be produced by adding the individual currents associated with each of the power converter phases.

In one embodiment, the monitor circuit 115 or other portion of power supply 110 includes an analog summer that sums individual currents for each of the phases as measured by the monitor circuit 115. An output of the summer circuit is fed into an analog to digital converter that, in turn, produces a digital value (i.e., $I_{OUT}$) or information parameter 410-3 representing the total current.

Note that the monitor circuit 115 as discussed with respect to FIG. 3 can include inaccuracies due to part tolerances of the monitor circuit 115 and operating conditions such as different voltages, temperatures, etc. The inaccuracies associated with parameter information 410-3 can be corrected via processing by modules 460 and 462.

For example, to allow for accurate calibration of the current, embodiments herein can include a slope correction term applied to the output current measurement.

In an example embodiment, a manufacturer can measure the system and change the slope term to correct for the error in the inductor parasitic resistance, which is used as the current sensor in one embodiment. The offset and slope correction terms can be stored in on-chip non-volatile memory of parameter management circuit 140 so that their values are retained indefinitely.

More specifically, in the example embodiment shown, the output of the de-multiplexer 444 labeled $I_{OUT}$ is fed into module 460 and module 462. The combination of modules 460 and 462 provide error correction associated with the measured current.

The values for Igain and Ioffest can vary depending on current operating conditions of the power supply 110. The different possible values for Igain (input to module 460) and Ioffset (input to module 462) can be determined during a calibration phase in which the output current is accurately measured or derived under one or more different operating conditions (e.g., different known load conditions) for which correction factors are determined. Thus, embodiments herein can include automatically determining the calibration values for the output current measurement and input current estimate by executing a calibration cycle in which one or more known accurate load values are applied to the power converter in test. The calibration parameters or calibration correction information can be determined automatically by the controller or power manager. The parameter management circuit 140 maintains the calibration correction information (Igain and Ioffset) derived as a result of applying at least one known load value to an output of the power converter phases during calibration.

Generation of values for Igain and Ioffset for modules 460 and 462 can be implemented in a number of different ways such as via a lookup table, an equation, etc.

As previously discussed, implementing both gain and offset correction via respective modules 460 and 462 produces a more accurate representation of the actual current delivered by one or more power converter phases to the load 118.

Accordingly, embodiments herein include receiving a raw output current value (e.g., parameter information 410-3) representing an amount of current supplied by the multiple power converter phases to the load 118 and applying calibration correction to the raw output current to produce a corrected output current value.

In one embodiment, the parameter management circuit 140 includes register 480-4 (e.g., a storage resource) to store a value representing the corrected output current as produced by a combination of modules 460 and 462. The parameter management circuit 140 stores this parameter information (e.g., a digital value representing the corrected output current) in register 480-4 for retrieval by entities in communication with the power supply 110.

Note that each register 480 as described herein is generally a storage resource that can be configured in a number of different ways such as flip-flop, memory, etc.

The corrected total output current value, $I_{OUT}$, such as the output of module 462, is fed into multiplier module 430. Recall that the output (e.g., parameter information 117-1) of module 428 is also fed into multiplier module 430. Multiplier module 430 outputs a value representing the estimated input current 160 based on multiplying the average pulse width modulation value (i.e., parameter information 117-1) by the corrected total current value $I_{OUT}$ (i.e., parameter information 117-2).

Note that the value outputted by module 430 such as the estimated input current 160 does not yet take into account other losses in the power supply 110. For example, there may be switch losses as well as drive circuit losses associated with power supply 110. Thus, this estimate of current obtained by the multiplying the pulse width by the inductor current is missing loss terms associated with the power required to charge and discharge the high side switch devices and low side switch devices (e.g., MOSFETS) in the power train and power required to provide bias to any control circuits that are also drive power from the input. Since these terms are largely constant they can be approximated by the addition of an offset term that can be calculated.

More specifically, to generate a more accurate estimate of current supplied by $V_{IN}$ to the power supply 110, the estimated input current 160 can be adjusted. As discussed above, multiplier module 432 and summer module 435 provide this adjustment so that the value $I_{in}$ more closely reflects the amount of current actually drawn from the input voltage 170.

Refer again to FIG. 2 illustrating multiple power converter phases present in switch circuit 120. As shown, the voltage source $V_{IN}$ supplies current through the drain-source paths of respective high side switches through corresponding inductor to the load 118. The estimated input current 160 represents a summation of these current for each of one or more power converter phases.

Note that $V_{IN}$ also provides amount of bias current required to power the driver circuits 210.

Additionally, $V_{IN}$ provides current required to drive gates of respective high side switch devices and low side switch devices.

As mentioned above, the multiplier module 432 and summer module 435 provide the appropriate adjustment to account for the extra consumption of current by power supply 110.

For example, multiplier module 432 can account for gate drive losses by multiplying the estimated input current 160 by the Igain value inputted to multiplier module 432. In one embodiment, the gate drive losses are proportional to the estimated input current and thus can be accounted for by choosing an appropriate gain value, Igain, and multiplying it by the estimated input current 160. The gain term (Igain) can be used to compensate for gate drive losses (which may be proportional to load current or input current) in an embodiment such as the variable gate drive circuit method as discussed in related application Ser. No. 12/143,048 entitled "POWER SUPPLY CIRCUIT AND DYNAMIC SWITCH VOLTAGE CONTROL," filed on the same day as the present application, the entire teachings of which are incorporated herein by this reference.

Thus, embodiments herein include modifying the estimate of input current 160 to account for an amount of current supplied by the power source, $V_{IN}$, to activate switches in the one or more power converter phases of power supply 110.

The specific value for Igain can be generated based on a lookup table, equation, etc., and can vary depending on current operating conditions of power supply 110 such as how many of multiple power converter phases are activated to produce the output voltage 180.

As mentioned, the driver circuits 210 are powered by voltage source $V_{IN}$ as shown in FIG. 2 and require a bias current to power such circuitry. Thus, the driver circuits 210 also draw current from voltage source $V_{IN}$.

The summer module 435 can account for this consumption by adding an appropriate offset value to the estimated input current 160. For example, the value Ioffset inputted to summer module 435 represents an amount of bias current required to operate the driver circuits 210. The Ioffset value may vary depending on operating conditions of the power supply such as how many of the drive circuits 210 are being powered. Newer multiphase buck converters disable or "shed" phases to improve light load efficiency. In such an instance, the Ioffset term and/or Igain values can be scaled adjusted by the number of phases shed to account for the decrease in losses as the phases are disabled.

Note that inclusion of the multiplier module 432 and the summer module 435 is shown by way of non-limiting example only and that the summer module 435 itself can be used to account for the different types of losses in power supply 110. For example, the gate-source losses associated with driving respective high side switch devices and low side switch devices can be accounted for by generating an appropriate offset value (rather than using a gain as discussed above). Such an offset value represents current consumed while operating the switches and adding the offset value to the estimated input current 160.

Accordingly, embodiments herein can include detecting which of multiple power converter phases is activated to supply power to the load 118, producing a bias value (i.e., Ioffset) representing an amount of current supplied by the power source to activate switches in the at least one power converter phase for delivery of the output current 180 to the load 118; and adding the bias value (i.e., Ioffset) to the estimated input current 160.

In a similar manner as discussed above for modules 460 and 462, generation of values for Igain and Ioffset for respective modules 432 and 435 can be implemented in a number of different ways such as via a lookup table, an equation, etc.

After implementing appropriate corrections and adjustments as discussed above, the output of summer module 435 represents a reasonable estimation of the amount of current that power supply 110 draws from the voltage source, $V_{IN}$, to produce the output current to keep the output voltage 180 within an acceptable range.

Note that parameter management circuit 140 includes register 480-6 to store a value representing the total input current estimated for $V_{IN}$. For example, the parameter management circuit 140 stores the value generated by module 435 in register 480-6 for retrieval by entities in communication with the power supply 110.

As shown, parameter management circuit 140 can include additional registers to store corresponding parameter information.

For example, register 480-1 of parameter management circuit 140 stores temperature information. In one embodiment, the power supply 110 includes a temperature sensing device to detect a temperature of the power supply 110 or part thereof. The temperature sensing device produces an analog output value inputted to an analog to digital converter. The output of the analog to digital converter produces parameter information 410-1 fed through a respective channel of multiplexer 440 and de-multiplexer 444 to a correction circuit including multiplier module 450 and summer module 452. The corresponding circuit corrects for errors via appropriate offset and gain adjustments. The parameter management circuit 140 stores the corrected temperature value in register 480-1 for retrieval by entities in communication with the power supply 110.

Register 480-2 stores a value representing a magnitude of the output voltage 180. In one embodiment, the output voltage is fed into an analog to digital converter to produce a digital value, $V_{CPU}$, representing the output voltage 180. The output of the analog to digital converter produces parameter information 410-2 fed through a respective channel of multiplexer 440 and de-multiplexer 444 for storage in register 480-2. The parameter management circuit 140 stores parameter information 410-2 in register 480-2 for retrieval by entities in communication with the power supply 110.

Register 480-3 stores a value representing a magnitude of the input voltage 170. In one embodiment, the input voltage 170 (i.e., $V_{IN}$) is fed into an analog to digital converter to produce a digital value, $V_{IN}$, representing the input voltage 170. The output of the analog to digital converter produces parameter information 410-4 fed through a respective channel of multiplexer 440 and de-multiplexer 444 for storage in register 480-3. The parameter management circuit 140 stores parameter information 410-4 in register 480-3 for retrieval by entities in communication with the power supply 110.

Parameter management circuit 140 includes register 480-5 to store a value representing the amount of power consumed by the load 118. For example, module 464 receives the corrected output current value from module 462 and multiplies it by the output voltage (e.g., $V_{CPU}$) to produce a value representing an amount of power consumed by the load 118. The parameter management circuit 140 stores the $P_{OUT}$ value generated by module 464 in register 480-5 for retrieval by entities in communication with the power supply 110.

Parameter management circuit 140 includes register 480-7 to store a value representing the amount of input power associated with voltage source $V_{IN}$. For example, module 431 receives a value representing the input voltage 170 (e.g., $V_{IN}$) and multiplies this by the parameter value in register 480-6 (which represents the estimated input current for input voltage 170 as previously discussed) to produce an output value stored in register 480-7 of parameter management circuit 140. In a similar manner as discussed above, the parameter management circuit 140 stores the value, $P_{IN}$, produced by module 431 in register 480-7 for retrieval by entities in communication with the power supply 110.

Efficiency of the power supply can be calculated based on dividing the average output power by the average input power. In a similar manner as discussed above, the parameter management circuit 140 can include a corresponding register (such as register 480-8) to store the calculated efficiency value, which equals $P_{OUT}/P_{IN}$. For example, in one embodiment, the value in register 480-5 is divided by the value in register 480-7 to produce the efficiency value stored in register 480-8. Note again that the registers 480 can be any type of storage for maintaining information about the respective power supply.

For flexibility reasons, the low pass filters used to create the average input voltage, output voltage, pulse width signals, inductor current, etc., can be programmable so that they may be set to different bandwidth values depending on the application.

Also, note that the on-chip registers 480 and other resources of the parameter management circuit 140 can have a programmable refresh rate so that a respective entity can control how often the parameters in registers 480 are updated. In one embodiment, the parameter management circuit 140 includes a programmable resource such as memory, register, etc., indicating a refresh rate or refresh rates in which to update the estimate of input current and/or values in respective registers 480. The parameter management circuit 140 can be configured to update the estimate of input current based on a setting of a respective refresh rate.

Figure 5:
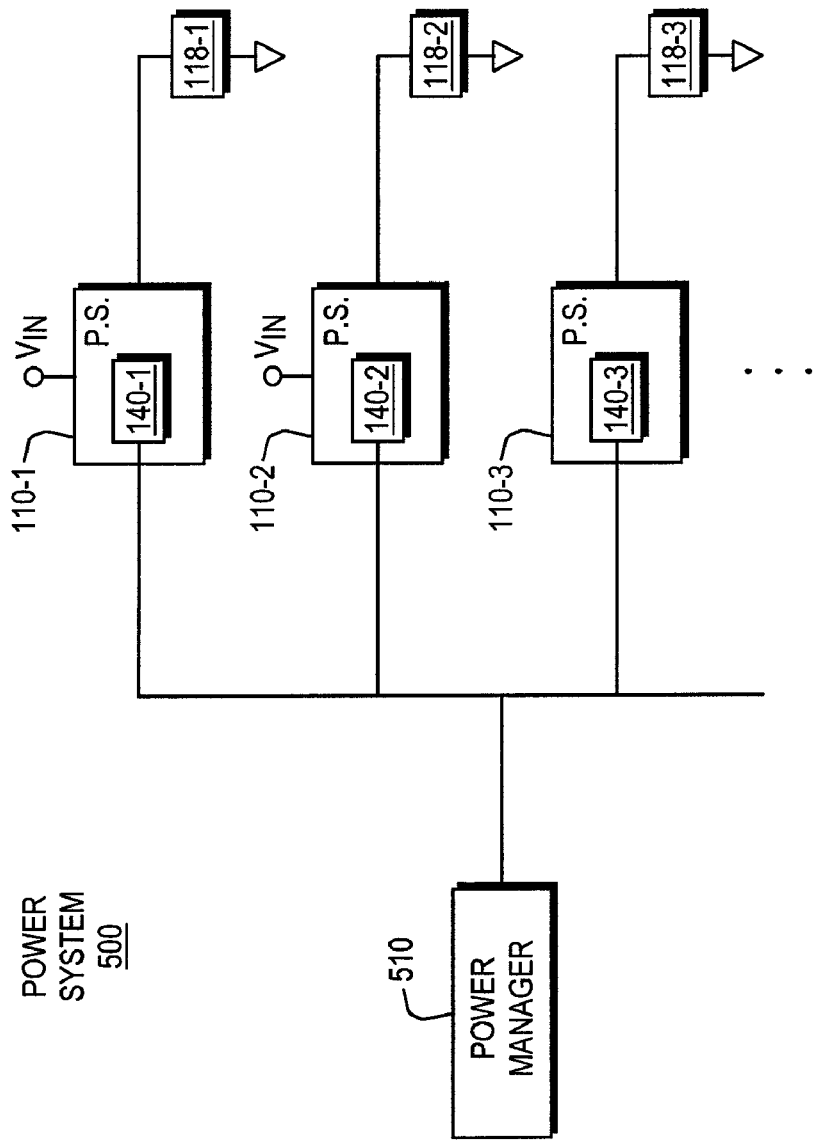
FIG. 5 is an example diagram illustrating management of power information at one or more different management tiers according to embodiments herein.

FIG. 5 is an example diagram illustrating a power system 500 including a power manager 510 according to embodiments herein. As shown, the power system 500 includes multiple power supplies 110 including power supply 110-1, power supply 110-2, power supply 110-3, etc. The power manager 510 communicates with the power supplies 110 via a communication link such as a standard serial bus interface such as I2C, SMBus, etc. In other embodiments, the power manager 510 communicates over a network such as the Internet to monitor a respective status of the multiple power supplies. Accordingly, the power manager 510 according to embodiments herein can have access to status information stored in the registers 480 for each of the different power supplies as discussed above.

Each power supply 110 in power system 500 includes a corresponding power supply parameter management circuit 140, registers 480, etc., and drives a corresponding load as discussed above. For example, power supply 110-1 includes power supply parameter management circuit 140-1 and produces a respective output voltage to drive load 118-1, power supply 110-2 includes power supply parameter management circuit 140-2 and produces a respective output voltage to drive load 118-2, power supply 110-3 includes power supply parameter management circuit 140-3 and produces a respective output voltage to drive load 118-3, and so on.

Each of the power supplies 110 can produce a respective output voltage for driving a respective load based on power provided by input voltage $V_{IN}$. In one embodiment, the power manager circuit 510 communicates with each power supply 110 to obtain parameter information from registers 480.

Based on analyzing information retrieved parameter information from the power supplies, the power manager 510 can detect different operating conditions such as when a given power supply is operating inefficiently possibly due to a circuit failure. Thus, embodiments herein include utilizing the estimated input current 160 to determine a health status of one or more of the power converter phases.

Additionally, in accordance with one example configuration, the power manager 510 can keep track of an overall amount of current used by the combination of power supplies 110 to drive corresponding loads. If necessary, the power manager 510 can perform operations such as scheduling of operations of the loads 118 so that the overall current drawn from the input voltage $V_{IN}$ does not exceed a threshold value. Other actions by the power manager 510 may include initiating a cooling function to dissipate heat associated with the any of loads 118 or corresponding power supplies 110 during conditions when the amount of current drawn from the input voltage is excessive.

In one embodiment, the power manager 510 includes a display screen for displaying a graphical user interface. A user can configure the power manager 510 to retrieve the information stored in registers 480 and display the retrieved values on the display screen for viewing. Accordingly, the user can be apprised of power supply status information.

Figure 6:
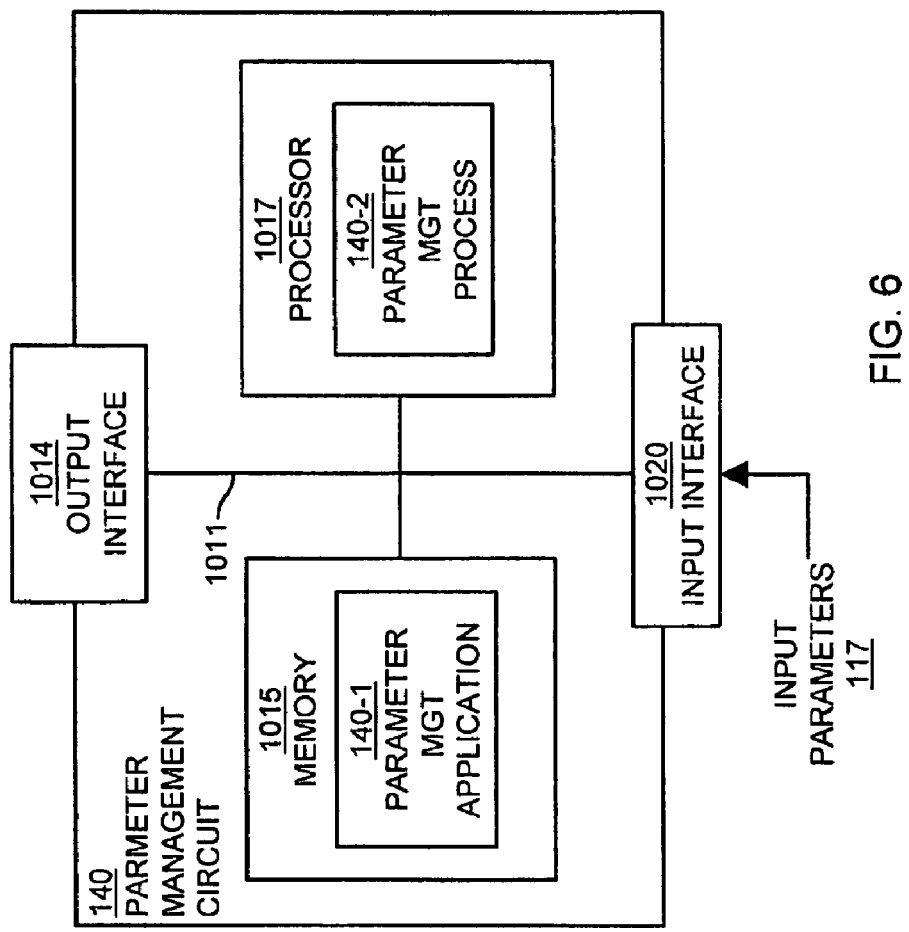
FIG. 6 is an example diagram illustrating a computer architecture for executing instructions according to embodiments herein.

FIG. 6 is a block diagram of an example architecture for implementing at least part of the parameter management circuit 140 according to embodiments herein. For example, the parameter management circuit 140 can include a DSP (Digital Signal Processor), FPGA (Field Programmable Gate Array), micro-controller, etc. to carry out the techniques as discussed above and further below.

As shown, power supply parameter management circuit 140 of the present example can include an interconnect 1011 that couples a memory system 1015, a processor 1017, output interface 1014, and an input interface 1020.

Memory system 1015 can be encoded with a parameter management application 140-1 that enables processor 1017 to support generation and storage of parameter information as described herein. The parameter management application 140-1 can be embodied as software code such as data and/or logic instructions (e.g., code stored in the memory or on another computer readable medium such as a disk) that supports processing functionality according to different embodiments described herein.

During operation according to one embodiment, processor 1017 accesses memory system 1015 via the use of interconnect 1011 in order to launch, run, execute, interpret or otherwise perform the logic instructions of the parameter management application 140-1. Execution of the parameter management application 140-1 produces processing functionality in parameter management process 140-2. In other words, the parameter management process 140-2 represents one or more portions of the parameter management application 140-1 performing within or upon the processor device 1017.

It should be noted that, in addition to the parameter management process 140-2 that carries out example method operations as discussed herein, other embodiments herein include the parameter management application 140-1 itself such as the un-executed or non-performing logic instructions and/or data for producing control signal(s) to control each of multiple voltage converter phases in switch circuit 110. The parameter management application 140-1 may be stored on a computer readable medium (e.g., a repository) such as a floppy disk, hard disk or in an optical medium. According to other embodiments, the parameter management application 140-1 can also be stored in a memory type system such as in firmware, read only memory (ROM), or, as in this example, as executable code within the memory system 1015 (e.g., within Random Access Memory or RAM). Note again that the parameter management application 140-1 can include instructions enabling a corresponding processor to carry out any of the processing as described herein.

Note that as an alternative to or in addition to implementing the parameter management circuit 140 using a processor and corresponding memory, embodiments herein can include implementing the parameter management circuit 140 in hardware using combinatorial logic. In other words, the parameter management circuit can be configured as a state machine (e.g., one or more semiconductor chips) providing the functionality as described herein.

Functionality supported by power supply parameter management circuit 140 will now be discussed via flowcharts below. For purposes of the following discussion, the parameter management application 140-1, and/or corresponding circuits generally performs steps in the flowchart. Note that there will be some overlap with respect to concepts discussed above. Also, note that the steps in the below flowcharts need not always be executed in the order shown.

Figure 7:
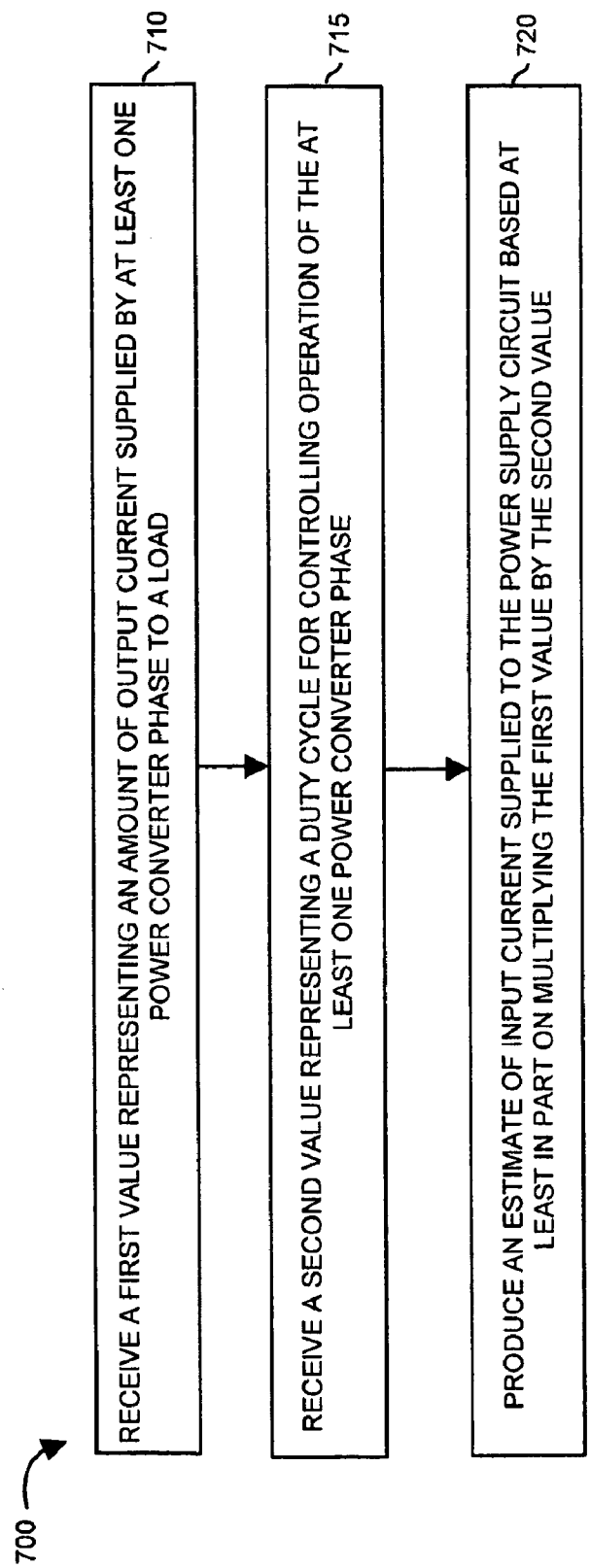
FIGS. 7, 8, and 9 are example diagrams illustrating methods for managing power supply parameters according to embodiments herein.

More specifically, FIG. 7 is a flowchart 700 illustrating a technique of managing power supply parameters according to embodiments herein.

In step 710, the power supply parameter management circuit 140 receives a first value representing an amount of output current supplied by at least one power converter phase to a load 118.

In step 715, the power supply parameter management circuit 140 receives a second value representing a duty cycle for controlling operation of the at least one power converter phase.

In step 720, the power supply parameter management circuit 140 produces an estimate of input current supplied to the power supply circuit based at least in part on multiplying the first value by the second value.

Figure 8:
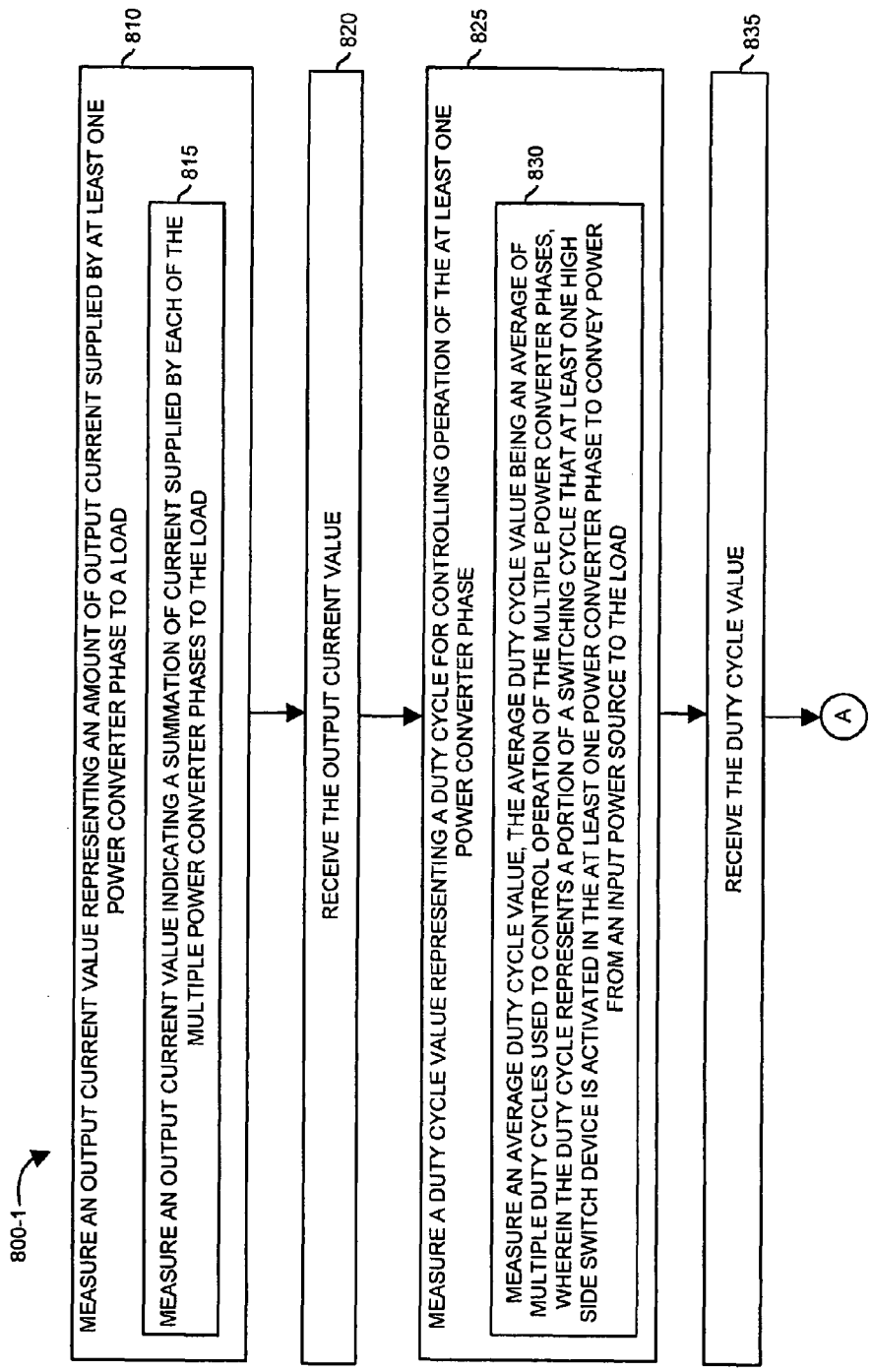
Figure 9:
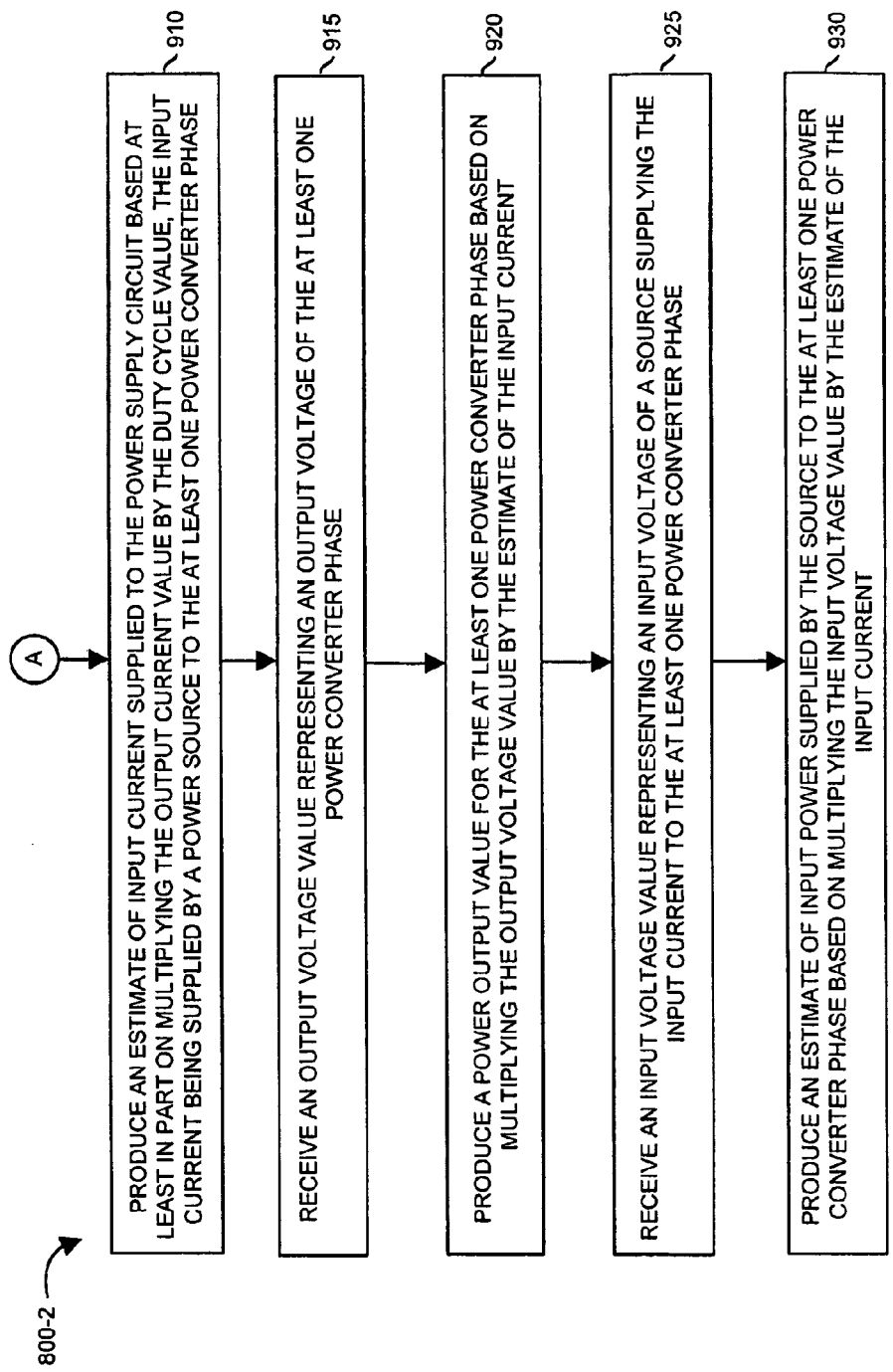

FIGS. 8 and 9 combine to form a flowchart 800 (e.g., flowchart 800-1 and flowchart 800-2) illustrating management of power supply parameters according to embodiments herein.

In step 810, the monitor circuit 115 measures an output current value representing an amount of output current supplied by each of one or more power converter phases.

In sub-step 815 of step 810, the monitor circuit 115 produces an output current value indicating a summation of current supplied by each of the multiple power converter phases to the load 118.

In step 820, the parameter management circuit 140 receives the output current value.

In step 825, the parameter management circuit 140 measures one or more duty cycle value representing corresponding duty cycles for controlling operation of one or more power converter phases.

In step 830, the power supply parameter management circuit 140 measures an average duty cycle value based on control signals generated by the controller 105. In one embodiment, the average duty cycle value based on an average of multiple duty cycles used to control operation of the multiple power converter phases. The duty cycle represents a portion of a switching cycle that at least one high side switch device is activated in the at least one power converter phase to convey power from an input power source to the load.

In step 835, the parameter management circuit 140 receives the duty cycle value.

In step 910, the power supply parameter management circuit 140 produces an estimate of input current supplied to the power supply circuit 110 based at least in part on multiplying the output current value by the duty cycle value. The estimate of input current represents current supplied by input voltage 170.

In step 915, the power supply parameter management circuit 140 receives an output voltage value representing the output voltage generated by one or more power converter phases.

In step 920, the power supply parameter management circuit 140 produces a power output value for the one or more power converter phases based on multiplying the output voltage value by the estimated input current.

In step 925, the power supply parameter management circuit 140 receives an input voltage value representing an input voltage 170 of a source (i.e., $V_{IN}$) supplying the input current to the power supply 110.

In step 930, the power supply parameter management circuit 140 produces an estimate of input power supplied by $V_{IN}$ to the one or more power converter phases based on multiplying the input voltage value by the estimate of the input current.

Note that techniques herein are well suited for use in power supply applications. However, it should be noted that embodiments herein are not limited to use in such applications and that the techniques discussed herein are well suited for other applications as well.

While this invention has been particularly shown and described with references to preferred embodiments thereof, it will be understood by those skilled in the art that various changes in form and details may be made therein without departing from the spirit and scope of the present application as defined by the appended claims. Such variations are intended to be covered by the scope of this present application. As such, the foregoing description of embodiments of the present application is not intended to be limiting. Rather, any limitations to the invention are presented in the following claims.

What is claimed is:

1. A method comprising:
in a parameter management circuit:
receiving a first value representing an amount of output current supplied by a power supply circuit to a load;
receiving a second value representing a duty cycle for controlling operation of the power supply circuit; and
producing an estimate of input current supplied to the power supply circuit based at least in part on multiplying the first value by the second value.

2. The method as in claim 1 further comprising:
in the parameter management circuit: receiving an output voltage value representing an output voltage of the power supply circuit; and
producing a power output value associated with the power supply circuit based on multiplying the output voltage value by the estimate of the input current.

3. The method as in claim 1 further comprising:
in the parameter management circuit:
receiving an input voltage value representing an input voltage of a source supplying the input current to the power supply circuit; and
producing an estimate of input power supplied by the source to the power supply circuit based on multiplying the input voltage value by the estimate of the input current.

4. The method as in claim 1, wherein the power supply circuit includes multiple power converter phases; and
wherein receiving the second value includes receiving an average duty cycle value, the average duty cycle value being an average of multiple duty cycles used to control operation of the multiple power converter phases.

5. The method as in claim 4, wherein receiving the first value includes receiving an output current value indicating a summation of current supplied by each of the multiple power converter phases to the load.

6. The method as in claim 5 further comprising:
in the parameter management circuit:
maintaining calibration correction information derived as a result of applying at least one known load value to an output of the power supply circuit;
receiving a raw output current value representing an amount of current supplied by the multiple power converter phases to the load; and
applying the calibration correction information to the raw output current to produce the output current value.

7. The method as in claim 1 further comprising:
in the parameter management circuit:
utilizing the estimate of input current to determine a health status of the power supply circuit.

8. The method as in claim 1, wherein the input current is supplied by a power source to the power supply circuit; and
wherein producing the estimate of input current includes modifying the estimate of input current to account for an amount of current supplied by the power source to activate switches in the power supply circuit for delivery of the output current to the load.

9. The method as in claim 8 further comprising:
in the parameter management circuit:
detecting which of multiple power converter phases in the power supply circuit is activated to supply power to the load;
producing a bias value representing an amount of current supplied by the power source to activate switches in the multiple power converter phases for delivery of the output current to the load; and
adding the bias value to the estimate of input current.

10. The method as in claim 1, wherein producing the estimate of input current includes:
modifying the estimate of input current to account for bias current used to power circuitry that controls operation of at least one power converter phase in the power supply circuit.

11. The method as in claim 1, wherein the input current is supplied by a power source to the power supply circuit; and
wherein the duty cycle represents a portion of a switching cycle that at least one high side switch device is activated in a power converter phase of the power supply circuit to convey power from the power source to the load.

12. A tangible computer-readable hardware storage medium having instructions stored thereon for processing data information, such that the instructions, when executed by a processing device, causes the processing device to perform the operations of:
receiving a first value representing an amount of output current supplied by at least one power converter phase to a load;
receiving a second value representing control information for controlling operation of the at least one power converter phase; and
producing an estimate of input current supplied to the power supply circuit based at least in part on multiplying the first value by the second value.

13. A system comprising:
a first storage resource to maintain a first value representing an amount of output current supplied by at least one power converter phase to a load;
a second storage resource to maintain a second value representing a duty cycle for controlling operation of the at least one power converter phase; and
a parameter management circuit configured to produce an estimate of input current supplied to the at least one power converter phase based at least in part on multiplying the first value by the second value.

14. A system as in claim 13 further comprising:
at least one programmable filter to filter sampling of the amount of output current and the duty cycle over time; and
wherein the parameter management circuit is configured to update the estimate of input current based on the filtered sampling.

15. A system as in claim 13 further comprising:
a programmable resource to set a refresh rate; and
wherein the parameter management circuit is configured to update the estimate of input current based on a setting of the refresh rate.

16. The system as in claim 13 further comprising:
a storage resource to maintain an output voltage value representing an output voltage of the at least one power converter phase; and
wherein the parameter management circuit is configured to produce a power output value associated with the at least one power converter phase based on multiplying the output voltage value by the estimate of the input current.

17. The system as in claim 13 further comprising:
a storage resource to maintain an input voltage value representing an input voltage of a source supplying the input current to the at least power converter phase; and

19 wherein the parameter management circuit is configured to produce an estimate of input power supplied by the source to the at least one power converter phase based on multiplying the input voltage value by the estimate of the input current.

18. The system as in claim 13, wherein the parameter management circuit is configured to utilize the estimate of input current to determine a health status of the at least one power converter phase.

19. The system as in claim 13, wherein the input current is supplied by a power source to the at least one power converter phase; and
wherein the parameter management circuit modifies the estimate of input current to account for an amount of current supplied by the power source to activate switches in the at least one power converter phase for delivery of the output current to the load.

20. The system as in claim 17, wherein the parameter management circuit is configured to:
detect which of multiple power converter phases is activated to supply power to the load;
produce a bias value representing an amount of current supplied by the power source to activate switches in the at least one power converter phase for delivery of the output current to the load; and
add the bias value to the estimate of input current.

21. A system comprising:
a power manager in communication with multiple power supplies;
each of the multiple power supplies producing an estimate of corresponding input current used by a respective power supply to power a corresponding load;
the power manager monitoring a health status of the multiple power supplies based on power supply status information derived by each of the multiple power supplies; and
wherein each of the multiple power supplies produces an estimate of corresponding input current to the respective power supply based at least in part on the respective power supply multiplying a first value by a second value, the first value representing an amount of output current supplied by the respective power supply to the corresponding load, the second value representing a duty cycle of the respective power supply; and
wherein the power manager is configured to monitor the health status based on retrieval of the estimate of corresponding input current from each respective power supply.

22. A system as in claim 21, wherein each respective power supply of the multiple power supplies produces power efficiency information, the power efficiency information produced by each respective power supply indicating an efficiency of converting an input voltage of the respective power supply to an output voltage for driving the corresponding load of the respective power supply; and
wherein the power manager is configured to monitor the health status based on retrieval of the power efficiency information from each respective power supply.

20

23. A system as in claim 21, wherein the power manager is configured to access the power efficiency information from the multiple power supplies to monitor the health status; and
wherein the power manager is configured to schedule operations associated with the corresponding loads based on the power efficiency information retrieved from each of the multiple power supplies.

24. A system as in claim 21, wherein the power manager is configured to access the power efficiency information from the multiple power supplies to monitor a degradation of the power supplies over time.

25. The management circuit as in claim 13, wherein the parameter management circuit comprises:
a processor;
a hardware storage resource that stores instructions associated with an application executed by the processor;
an interconnect coupling the processor and the hardware storage resource; and
wherein the processor is configured to execute the instructions to produce the estimate of input current supplied to the at least one power converter phase.

26. A system comprising:
a first storage resource to store a first value representing an amount of output current supplied by a power converter phase to a load;
a second storage resource to store a second value representing a duty cycle used to control switching operation of the power converter phase; and
a parameter management circuit configured to produce, based at least in part on multiplying the first value by the second value, an estimate of input current supplied through switch circuitry of the power converter phase to power the load.

27. The method as in claim 1, wherein the first value indicates the amount of output current supplied to the load by at least one power converter phase in the power supply circuit;
wherein the duty cycle indicates a portion of a switching cycle in which the at least one power converter phase is activated to produce the output current to power the load; and
wherein the estimate of input current indicates an amount of current inputted to the at least one power converter phase to produce the output current to power the load.

28. The system as in claim 27, wherein the duty cycle represents a portion of a switching cycle that at least one high side switch device in the at least one power converter phase is turned to an ON state to convey the input current through the at least one power converter phase to the load.

29. The system as in claim 13, wherein the input current is supplied by an input power source to at least one power converter phase in a power supply circuit; and
wherein the duty cycle represents a portion of a switching cycle that at least one high side switch device in the at least one power converter phase is turned to an ON state to convey power from the input power source through the at least one power converter phase to the load.

* * * * *